US008669790B2

(12) United States Patent
Colombo et al.

(10) Patent No.: US 8,669,790 B2
(45) Date of Patent: Mar. 11, 2014

(54) CONTROL CIRCUIT ARRANGEMENT FOR PULSE-WIDTH MODULATED DC/DC CONVERTERS AND METHOD FOR CONTROLLING A PULSE-WIDTH MODULATED CONVERTER

(75) Inventors: Matteo Colombo, Verrua Po (IT); Carlo Fiocchi, Belgioioso (IT)

(73) Assignee: austriamicrosystems AG (AT)

( * ) Notice: Subject to any disclaimer, the term of this patent is extended or adjusted under 35 U.S.C. 154(b) by 0 days.

(21) Appl. No.: 13/459,943

(22) Filed: Apr. 30, 2012

(65) Prior Publication Data

US 2012/0280726 A1  Nov. 8, 2012

(30) Foreign Application Priority Data

May 2, 2011 (EP) .................................. 11164491

(51) Int. Cl.
*H03B 1/00* (2006.01)
(52) U.S. Cl.
USPC .......................................................... 327/108
(58) Field of Classification Search
USPC ......... 327/108–112, 170, 172–176, 389, 391; 326/22–27, 82, 83; 365/230.06
See application file for complete search history.

(56) References Cited

U.S. PATENT DOCUMENTS

| | | | |
|---|---|---|---|
| 5,760,610 A | 6/1998 | Naffziger | |
| 5,867,453 A | 2/1999 | Wang et al. | |
| 5,930,132 A | 7/1999 | Watanabe et al. | |
| 6,965,260 B1 * | 11/2005 | Ye et al. | 327/175 |
| 7,554,372 B1 | 6/2009 | Wong | |
| 2009/0302918 A1 | 12/2009 | Sagisaka et al. | |
| 2011/0012577 A1 * | 1/2011 | Wang et al. | 323/283 |

OTHER PUBLICATIONS

J.S. Choi et al., "A Novel Dead Time Minimization Algorithm of the PWM Inverter," *Conference Record of the 1999 IEEE Industry Applications Conference, thirty-fourth IAS Annual Meeting*, vol. 4, Oct. 3, 1999, pp. 2188-2193.
B. Zhang et al. "A Novel IGBT Gate Driver to Eliminate the Dead-Time Effect," *Conference Record of the 2005 IEEE Industry Applications Conference fortieth IAS Annual Meeting*, vol. 2, Oct. 2, 2005, pp. 813-817.
J.S. Choo et al., "A Novel Dead Time Minimization Algorithm of the Pwm Inverter," *Conference Record of the 2005 IEEE Industry Applications Conference fortieth IAS Annual Meeting*, vol. 2, Oct. 2, 2005, pp. 813-817.
B. Zhang et al. "A Novel IGBT Gate Driver to Eliminate the Dead-Time Effect," *Conference Record of the 1999 IEEE Industry Applications Conference, thirty fourth IAS Annual Meeting*, vol. 4, Oct. 3, 1999, pp. 2188-2193.

* cited by examiner

*Primary Examiner* — Lincoln Donovan
*Assistant Examiner* — Sibin Chen
(74) *Attorney, Agent, or Firm* — DLA Piper LLP (US)

(57) ABSTRACT

A control circuit arrangement for pulse-width modulated DC/DC converters includes a phase generator for a complementary driver which provides respective gate signals to a first and second driver transistor in response to a control signal. A clock control circuit receives a clock signal and a pulse-width modulated signal and provides the control signal in response to a signal edge of the pulse-width modulated signal and the clock signal applied thereto. A mode selection input terminal receives a mode selection signal to select a first mode or a second mode of operation. The phase generator provides in the first mode each of the gate signals the control signal and the respective other gate signal. In the second mode of operation, it provides each gate signal in response to the control signal.

21 Claims, 7 Drawing Sheets

CONTROL CIRCUIT ARRANGEMENT FOR PULSE-WIDTH MODULATED DC/DC CONVERTERS AND METHOD FOR CONTROLLING A PULSE-WIDTH MODULATED CONVERTER

RELATED APPLICATIONS

This application claims priority to European Application No. 11164491.0, filed May 2, 2011, the subject matter of which is incorporated by reference.

TECHNICAL FIELD

This disclosure relates to control circuit arrangements for pulse-width modulated DC/DC converters and to methods for controlling such converters.

BACKGROUND

DC/DC converters are nowadays used in a plurality of different applications to provide a supply signal to loads connected thereto. For such purpose, the DC/DC converters are often pulse-width modulated with a selectable duty cycle modulation in response to a current drawn by the load connected to the converter. The DC/DC converter comprises a complementary driver having respective driver transistors, for instance a PMOS or an NMOS transistor connected in series. In operation, the transistors are selectively switched off or on depending on the pulse-width modulation. For a complementary digital driver having a P- and NMOS driver transistor connected in series, it is necessary that both transistors are not contemporarily in the on-state.

Consequently, a feedback network may be provided to recognize that one of the transistors is already in the off-state before switching on the other transistor of the complementary driver.

Furthermore, it is important in DC/DC converters to fix a minimum duration which lets one of the driver transistors of the complementary driver off instead of allowing the one driver transistor to decrease progressively to zero. As some analog parts inside the block of the DC/DC converter must be reset between the end of an on-pulse of one driver transistor and the beginning of the following one, a minimum off-time, i.e. a smallest possible off-time or a limitation below which it is not possible to go, is needed to accomplish these operations. On the other hand, it is desirable that the complementary driver does not stay off longer than necessary, even if this is usually a matter of a few nanoseconds. Such minimum off-time for the PMOS can have a very large spread, depending on production process as well as operating conditions.

Given the need of a disoverlap time, the conduction of the first and the second driver transistor of a complementary driver in the power stage raises a limitation, in particular a lower limit over the minimum duration of the off-pulse of the PMOS driver transistor.

It could therefore be helpful to provide a maximum duty cycle of the DC/DC converter even if the frequency of the pulse-width modulated signal is increased. It could further be helpful to provide an optimal disoverlap time in the conduction of the power stage complementary transistors to be maintained when the DC/DC converter is operated at a duty cycle slightly below the maximum achievable one.

SUMMARY

We provide a control circuit arrangement for pulse-width modulated DC/DC converter including a phase generator for a driver which provides respective gate signals (gaten, gatep) to a first and a second driver transistor, the phase generator including a first input terminal for a control signal (p_off_pwm), and a clock control circuit having a clock input terminal for a clock signal (xclk) and an input terminal for a pulse width modulated signal (pwm), the clock control circuit providing the control signal (p_off_pwm) in response to signal edges of the pulse width modulated signal (pwm) and the clock signal (xclk) applied thereto, wherein the phase generator further includes a mode selection input terminal for a mode selection signal (hd), and the phase generator includes a selection circuit to select a first mode of operation or a second mode of operation based on the mode selection signal (hd), and the phase generator provides a) in the first mode of operation each of the gate signals (gaten, gatep) in response to the control signal (p_off_pwm) and in response to the respective other gate signal, b) in the second mode of operation a first one of the gate signals (gaten, gatep) in response to the control signal (p_off_pwm), and c) a second one of the gate signals (gaten, gatep) in response to the control signal (p_off_pwm) and the clock signal (xclk).

We also provide a method for controlling a pulse-width modulated DC/DC converter having a driver comprising a first and a second driver transistor, including sensing a state of gate signals (gaten, gatep) at the gates of the first and second driver transistors at a rising edge of a timing clock signal (clk, xclk), generating a mode selection signal (hd) in response to the sensing, and 1) generating the gate signals (gaten, gatep) in response to the timing clock signal (clk, xclk) and in response to the state of the respective other gate signal in a first state of the mode selection signal (hd) or 2) generating the gate signals (gaten, gatep) in response to the timing clock signal (clk, xclk) in a second state of the mode selection signal (hd).

DETAILED DESCRIPTION

It will be appreciated that the following description is intended to refer to specific examples of structure selected for illustration in the drawings and is not intended to define or limit the disclosure, other than in the appended claims.

The basic principle is related to the fact that the control circuit arrangement operates in two different modes depending on the duty cycle of the pulse-width modulated signal or a clock signal derived from it. In a first mode of operation corresponding to a moderate duty cycle, gate signals to drive the respective driver transistor of the complementary driver are generated in response to the pulse-width modulated signal taking into account the state of the respective other gate signal. As such, a gate signal is switched depending on the state of the other gate signal. Operating in this mode ensures that both driver transistors are not contemporarily in an on-state. A feedback network implemented in the control circuit may recognize the state of one driver transistor and in dependence of the state switch the gate signal for the respective other driver transistor. As a result, a disoverlap of the transistor conduction is achieved.

On the other hand, the control circuit arrangement inherits a second mode of operation, in which any feedback is bypassed. In the second mode, both gate signals for the driver transistors of the complementary driver are generated in response to the clock signal only. For this purpose, a small artificial delay time is introduced to ensure a switching of one of the driver transistors before the second one.

We provide a state machine which switches between two different modes of operation, wherein in a first mode a feedback network is used to generate gate signals to drive the transistors for the complementary driver while in a second operation mode the feedback network is bypassed and the gate of the transistors driven directly to the extent that conduction of one of the driver transistors is terminated at a predetermined time prior to the second drive transistor. The mode of operation depends on the operating duty cycle. Particularly, the second mode of operation is activated as soon as the operating duty cycle approaches a critical threshold. In this way, a very high duty cycle can be achieved while at the same time preserving a low disoverlap time in most of the process and operating corners when the duty cycle itself is below its upper limit.

We also provide a control circuit arrangement having a phase generator for a complementary driver. The phase generator is adapted to provide respective gate signals to a first and a second driver transistor and comprises a first input terminal for a control signal. A clock control circuit comprising a clock input terminal for a clock signal and an input terminal for a pulse-width modulated signal provides the control signal in response to a signal edge of the pulse-width modulated signal and the clock signal.

The phase generator may further comprise a mode selection input terminal for a mode selection signal and a respective selection circuit. The selection circuit is adapted to select a first mode of operation or a second mode of operation of the phase generator based on the mode selection signal. In the first mode of operation, a phase generator provides each of the gate signals in response to the control signal and in response to the respective other gate signal. In other words, the phase generator generates in the first mode of operation the gate signals in response to the control signal and in response to the state of the other gate signal. In the second mode of operation, the phase generator generates each gate signal in response to the control signal bypassing the state of the respective other gate signal.

The mode selection signal may be dependent from a duty cycle of a pulse-width modulated signal from a duty cycle of the clock signal and/or from duty cycle at the complementary output. To this extent, the duty cycle may comprise a moderate duty cycle at which the first mode of operation is selected for the phase generator or a high duty cycle at which the phase generator operates in the second mode. The term "duty cycle" is defined as the ratio between the pulse duration and the period of a rectangular wave form. A moderate duty cycle may include a pulse duration less than about 90% and particularly less than about 95%. Accordingly, a high duty cycle may occur if the pulse duration is more than about 90% and preferably more than about 95% of the period of the rectangular wave form.

The phase generator may comprise a first logic gate, the output of which is coupled to the gate of the first driver transistor and a second logic gate the output of which is coupled to the gate of the second driver transistor. First inputs of both gates are adapted to receive the control signal while a second input of the first logic gate is coupled to the selection circuit and a second input of the second logic gate is coupled to the gate of the first driver transistor. Accordingly, the phase generator comprises a feedback network which can be bypassed by the selection circuit. In both modes of operation, the second logic gate nevertheless receives the state of the gate signal applied to the first driver transistor. This ensures generation of the gate signal of the second driver transistor to some extent depending on the state of the gate signal of the first driver transistor.

The phase generator may also comprise a third logic gate coupled to the second logic gate to provide the control signal to the first input of the second logic gate depending on the clock signal in the second mode of operation. This example prevents the second driver transistor from conducting in a high duty cycle condition. This ensures that the next conduction of the first driver transistor can be triggered faster without any risk of contemporary conduction of the transistors in the complementary driver output. As a result, the first gate signal is generated before the second gate signal.

The selection circuit may comprise a first logic gate being part of the loop of the phase generator. Depending on the state of the logic gate, the loop is closed or opened, corresponding to the operation in the first or second mode. The selection circuit may be adapted to receive on a first input a gate signal of one of the first and second driver transistor and on the second input the mode selection signal. In a first mode of operation given by the mode selection signal, the logic gate forwards the respective gate signal to the other one of the first and second driver transistor. In the second mode of operation, the logic gate does not forward the gate signal applied to its first input.

The selection circuit may also comprise a third logic gate adapted in the second mode of operation to provide the clock signal to the second logic gate. Accordingly, the second logic gate uses the clock signal to provide the control signal to the first input of the third logic gate in response to the clock signal in the second mode of operation.

A further aspect is related to the generation of the clock signal in the second mode of operation. As already stated during the second mode of operation, an open loop is implemented in the phase generator generating the gate signals without a feedback and without evaluating the states of the respective other gate signals. In other words, in the second mode of operation, the gate signals are generated in response to the clock signal. To nevertheless ensure that a disoverlap time between one driver transistor going off and the other driver transistor going on does not become too small, the second driver transistor is not allowed to turn on in a time interval before the next transition to low state of the clock signal, corresponding to first driver transistor turn-on. For this purpose, the circuit arrangement may comprise a clock generator adapted to provide the clock signal in response to a base clock wherein the clock generator comprises a delay unit, that delay unit determining a pulse-width of the clock signal. That delay is inherited during generation of the respective gate signals to ensure a sufficient disoverlap time.

The delay unit may comprise at least one analog delay cell to receive the base clock and provide a delayed base clock signal. An analog delay cell is advantageous compared to a digital clock because it can be much better controlled during the manufacturing process and is less sensitive to process and temperature variations. Preferably, the delay time may depend on an RC product within the analog delay cell.

The circuit arrangement may comprise a duty cycle recognition circuit. The recognition circuit is able to obtain information about the duty cycle and in response to the information determines whether the phase generator is to be operated in its first or second mode. For this purpose, the respective gate signals may be evaluated. The duty cycle recognition circuit may be coupled with its inputs to the gate of the second driver transistor and to the input terminal of the clock signal. The duty cycle recognition circuit, which may preferably comprise a flip-flop circuit, may be adapted to provide the mode selection signal in response to an offset between edges of the clock signal and the gate signal of the second driver transistor. When the signal at the second driver transistor is at a high state before the positive edge of a clock signal arrives, the duty cycle is considered to be moderate.

The duty cycle recognition circuit may comprise two additional logic gates coupled with their outputs to a first input of the respective other gate and with a second input to the gates of the first and second driver transistor. In this case, the two logic gates evaluate the gate signals applied to the driver transistors of the complementary driver.

In a method for controlling a pulse-width modulated DC/DC converter having a complementary driver comprising a first and second driver transistor, the state of gate signals applied to the gates of the first and second driver transistor at a rising or falling edge of a timing clock signal is sensed and evaluated. A mode selection signal in response to the sensing is generated. The gate signals to drive the driver transistors are now generated in response to the timing clock signal and the state of the respective other gate signal in a first state of the mode selection signal. In a second state of the mode selection signal, the gate signals are generated in response to the timing clock signal, but not in response to the state of the respective other gate signal.

The method for controlling a pulse-width modulated DC/DC converter inherits a closed or an open loop for generating the gate signals depending on the state of the mode selection signal. The closed loop for generation of the gate signals is used in a first state of the mode selection signal corresponding to a moderate duty cycle of a pulse-width modulated signal or the timing clock signal. The open loop not taking into account the state of the respective other gate signal to drive the transistors is used in the second state of the mode selection signal corresponding to a high duty cycle of the pulse-width modulated signal.

In the following, our arrangements and methods are explained in greater detail together with the Drawings.

Figure 1:
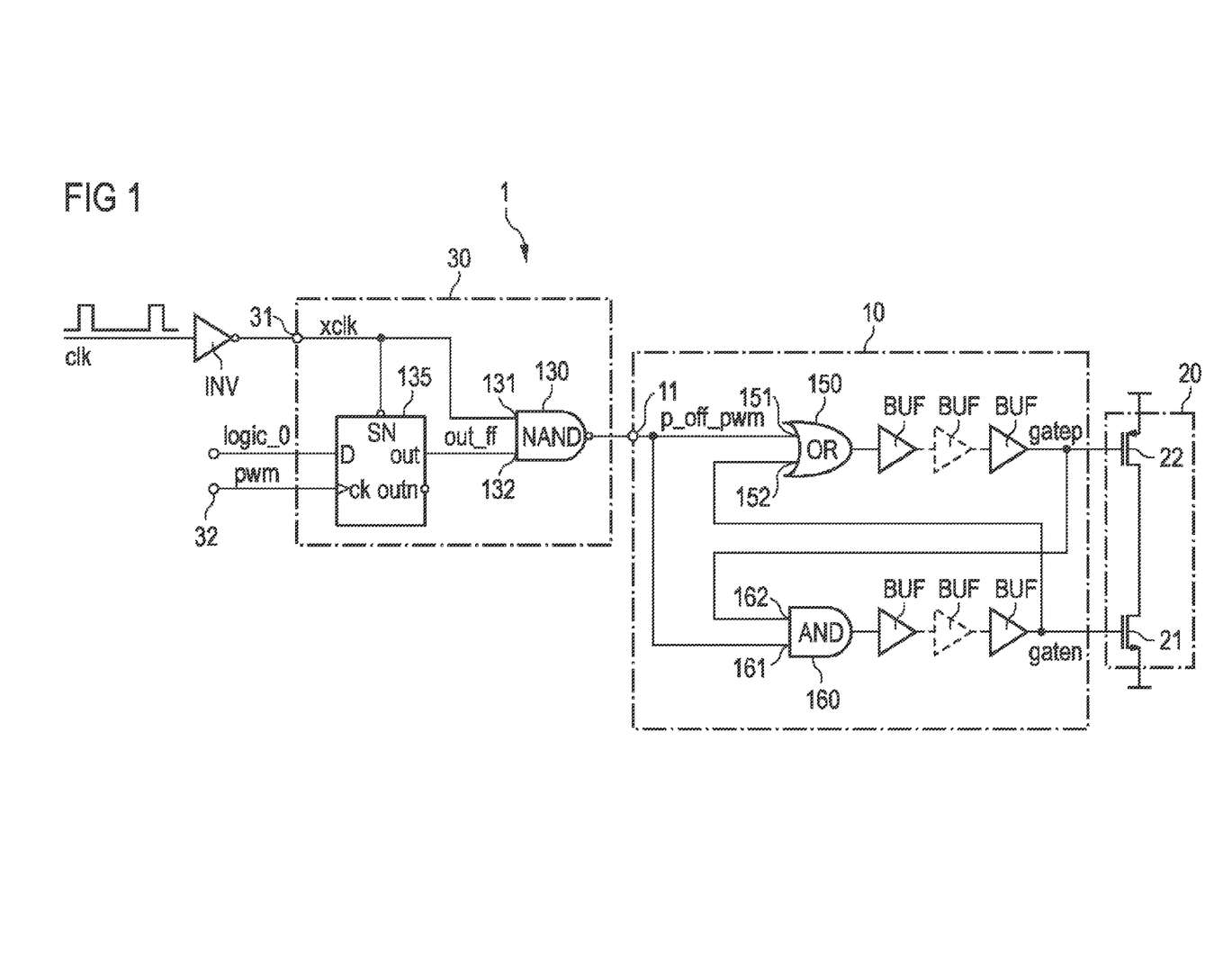
FIG. 1 illustrates a mode control circuit including a closed loop for driving a complementary driver.

The control circuit 1 comprises a phase generator 10 for driving a complementary driver 20 as well as a clock control circuit 30. The complementary driver 20 includes two field-effect transistors 21, 22 of complementary types arranged between a supply terminal and a ground terminal. It should be noted that the complementary driver is not required, but other kinds of power output drivers can be used as well as long as the correct polarity of signals generated to drive the transistors in the driver is ensured. The complementary driver is a non-limiting example.

In the example, PMOS transistor 22 is arranged in series to NMOS transistor 21, which is connected to the ground terminal. The respective control terminals of both transistors are coupled to output terminals of phase generator 10 receiving gate signal gaten and gatep, respectively.

Phase generator 10 comprises a first buffer chain including several buffers connected in series, of which three are shown, as well as a second buffer chain preferably comprising the same amount of buffers connected in series. The input of the first buffer chain is coupled to an output of an OR gate 150 while the input of the second buffer chain is connected to an AND gate 160. The output of the first buffer chain providing the gate signal gatep is connected to the control terminal of PMOS transistor 22 as well as to input terminal 162 of AND gate 160. Vice-versa, the second buffer chain provides a gate signal gaten and is coupled to a gate terminal of transistor 21 and to input terminal 152 of OR gate 150.

Phase generator 10 also comprises an input terminal 11 at which a control signal p_off_pwm can be applied to. The input terminal 11 is connected to terminal 161 of AND gate 160 and 151 of OR gate 150. This structure implements a closed loop at which the states of the respective gate signals gatep and gaten are used to be evaluated in the respective logic gates 150, 160.

The input terminal 11 for control signal p_off_pwm is coupled to clock control circuit 30. Clock control circuit 30 comprises a clock input terminal 31 connected to an input terminal 131 of NAND gate 130. Further, control circuit 30 includes flip flop circuit 135 connected with its clock terminal CK to input terminal 32 for a pulse width modulated signal. The non-inverting output OUT providing flip flop signal out_ff is coupled to the second input terminal 132 of the NAND gate 130. At the data input D of flip flop 135, a logic signal logic_0 is applied. Finally, an inverted clock signal is applied to clock input terminal 31 of the clock control circuit.

The clock pulse clk dictates the timing of the clock control circuit and, therefore, the phase generator. The clock signal clk may include a very narrow duty cycle waveform. Its falling edge, which follows the rising one with a few nanoseconds delay, is meant to bring PMOS transistor 22 in conduction if several conditions are met. The gatep signal with state ON can be terminated by the feedback regulation loop within the phase generator 10 before the clock rising edge clk. This event may represent an extreme time until the PMOS conduction can take place.

Comparing the several states of PMOS transistor 22 with NMOS transistor 21, the latter state should be complementary to the PMOS one. That means a clock falling edge of clock clk shall bring NMOS transistor 22 into the off-state, if not already off, while the NMOS conduction state of transistor 21 may be triggered only after the PMOS transistor is turned off. The respective gate signal gaten shall keep the transistor 21 in the on-state until the next falling edge of clock clk.

Figure 6:
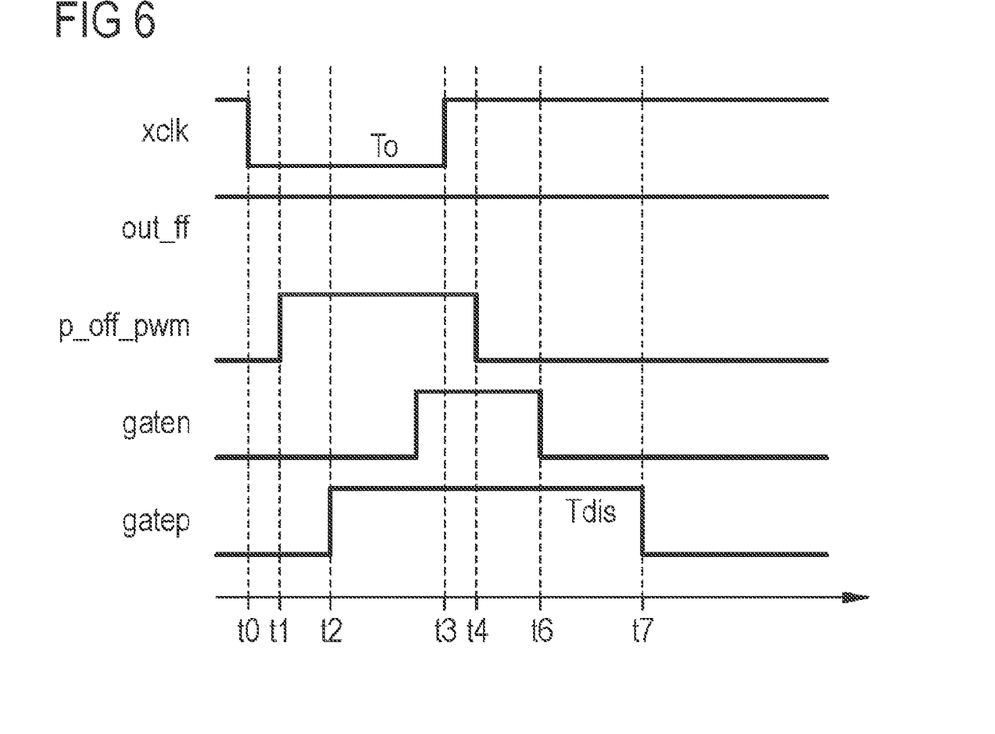
FIG. 6 shows a timing diagram referring to the high duty cycle condition associated with the control circuit arrangement according to FIG. 1.

For this purpose, flip flop 135 receives on its set input SN the inverted clock signal xclk, which comprises in this instance a very small duty cycle. FIG. 6 illustrates the time diagram for several signals at various points in time during operation of the stage according to FIG. 1. FIG. 6 shows a condition where the PMOS conduction is terminated by the clock signal xclk and not by a pulse width modulated signal (pwm (32) in FIG. 1).

When clock signal clk enters the high-state at time t0, it acts on input SN of flip flop 135 to set the HIGH-state for output signal out_ff. That signal tends to set the on-state for the PMOS transistor 22, but the cascaded NAND gate stops the transition until the low state of signal xclk is evaluated in the NAND gate. At this time t1, as illustrated in FIG. 6, the output signal of NAND gate 130 at input terminal 11 of the phase generator goes to "high". The signal is applied to both gates in phase generator 10. The evaluation of the high state in signal p_off_pwm in OR gate 150 and the additional delay in the buffer chain leads to a transition of gate signal gatep from low to high at time t2. Signal gatep is fed back in the closed loop to AND gate 160, whose output goes high as well and provides gate signal gaten with the state high after the delay chain.

At time t2, PMOS transistor 22 is turned off by the low to high transition of gate signal gatep. At some time later, the low to high transition of gate signal gaten short before time t3 brings transistor 21 into conduction. At time t3, clock signal xclk rises to high state, while the signal from flip flop 135 stay in high state. Both signals are applied to the NAND gate, which in turn at time t4 provides a transition from high to low for signal p_off_pwm. As this signal is also applied at input terminal 161 of AND gate 160, gate signal gaten drops down to low state at time t6, whereby this time span is given by the delay in the second delay chain.

The transition from high to low for gate signal gaten releases the OR gate 150 so that after an additional delay due to the cascaded buffers, signal gatep drops to low state at time t7, consequently bringing PMOS transistor 22 to conduction. As a result, the total delay to provide effective PMOS conduction is given by the delay of the AND gate, the OR gate, the NOR gate as well as several cascaded buffers.

The control circuit arrangement according to FIG. 1 is implemented such that the state of the NMOS transistor 21 is evaluated and recognized to be in the off state before the PMOS transistor 22 is switched on again. This is basically given by the time difference between time t7 and t4. As a result, the off time for the PMOS transistor 22 may appear excessive, particularly in those operating conditions which are detrimental to CMOS speed, namely process parameters, high temperature and low supply voltage.

Referring back to FIG. 1 together with the time diagram of FIG. 6, the minimum off time for PMOS transistor 22 is given by the following contributions.

At the rising edge of clock signal clk, corresponding to the falling edge of clock signal xclk, transistor 22 is supposed to be in state HIGH. At the transition from high to low of clock signal clk, it takes the time Tdp_off to switch transistor 22 off. This time is given by T2 in FIG. 6, corresponding to the time at which signal gatep switches to the on state. At the next falling edge of clock signal clk, corresponding to the rising edge of clock signal xclk at time T3, it is necessary to switch off the NMOS transistor 21 before bringing the PMOS transistor 22 back to conduction. Under the assumption that the duration of the clock pulse signal clk is given by $T_0 = t3 - t0,$ the NMOS transistor 21 is switched off by gate signal gaten after time Tdn_off (at time t6). The duration between t7 and t6, $T\_dis = t7 - t6$ wherein at time t7 the PMOS transistor 22 is brought back into conduction, is given by Td_fdbk+Tdp_on, whereby the first term corresponds to the time until the feedback network recognizes gaten is off and the second term takes into account the time required to bring PMOS transistor 22 to conduction at time t7. The total duration T_off at which PMOS transistor 22 is in the off state, is given by $T\_off = T_0 + Tdn\_off + Tdp\_on + Td\_fdbk - Tdp\_off.$ While the first term t0 can be carefully controlled by an analog delay cell, i.e. implementation, the other term contributions result from pure CMOS gates, which may be extremely sensitive to process and temperature variations. Under unfavorable circumstances (slow process, high temperature, low supply voltage), T_off may become very large, which could be a problem, particularly with extremely high duty cycles because the maximum achievable duty cycle becomes remarkably limited. As a result, the PMOS off duration T_off limits the duty cycle.

On the other hand, the disoverlap time T_dis given by the delays in the feedback network could be reduced as it is only necessary to switch off the NMOS before bringing the PMOS transistor back into conduction. Without the interaction of the feedback network, any contribution from the NMOS gate disappears and the total off time for the PMOS transistor T_off is given by the first three terms resulting in $T\_off = T_0 + Tdp\_on + Tdp\_off.$ In particular, it eliminates the contribution from Td_fdbk which suffers from the largest spread vs. operating conditions.

Figure 2:
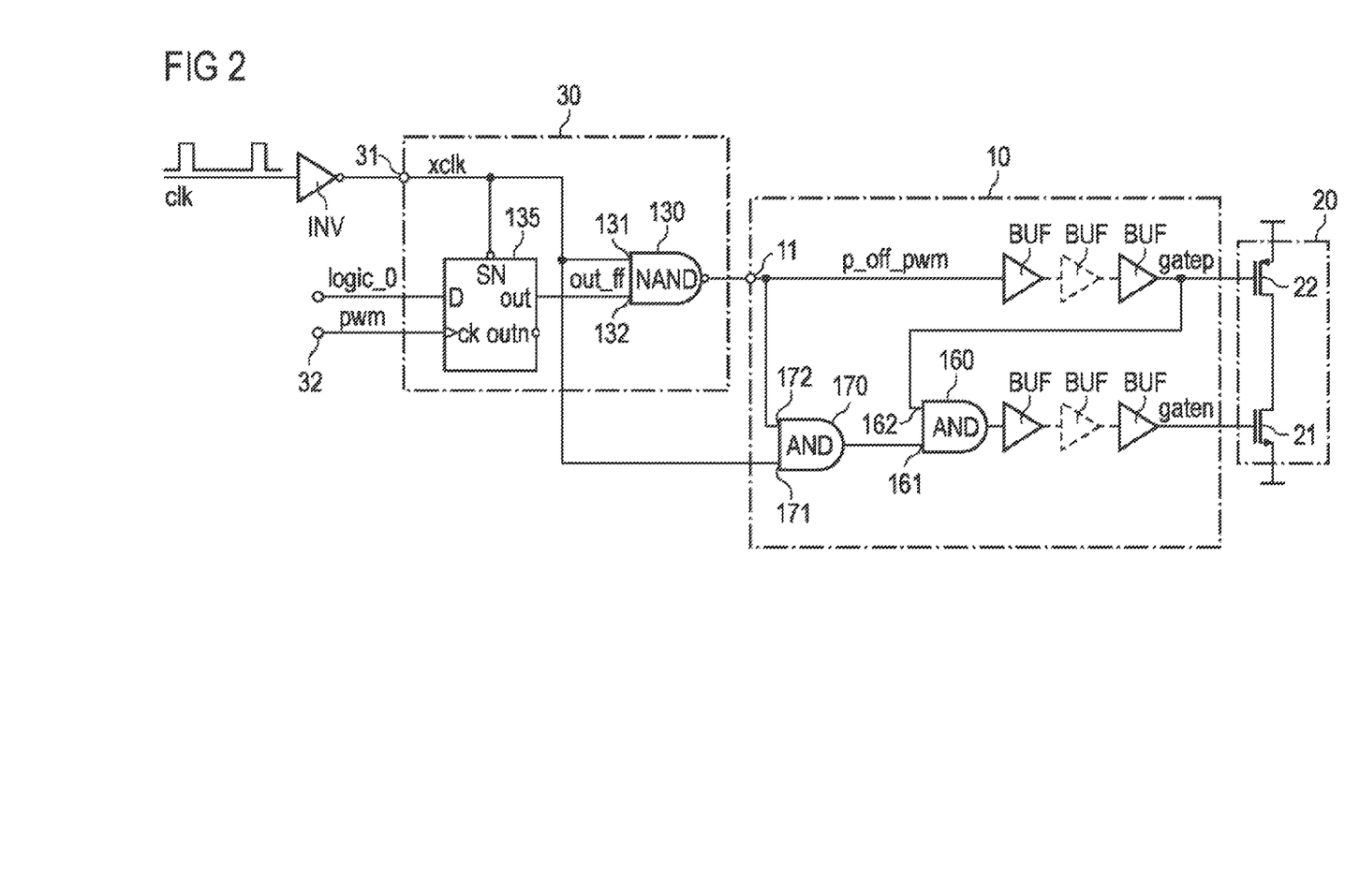
FIG. 2 shows a control circuit arrangement implementing an open loop to drive a complementary driver.

FIG. 2 illustrates an example of a control circuit arrangement without a feedback network providing a much lower duration for PMOS transistor 22 to be in the off state. For this purpose, phase generator 10 comprises a first buffer chain generating a gate signal gatep, wherein the input terminal 11 is connected directly to the first inverter of the buffer chain. Consequently, the OR gate is deleted in this example. A gate signal gatep is also applied to AND gate 160 at input 162. Further, phase generator 10 comprises an AND gate 170, whose output is coupled to the first input of AND gate 160. At the input terminals of AND gate 170, signal p_off_pwm from first input terminal 11 or the clock signal xclk are applied to.

Figure 7:
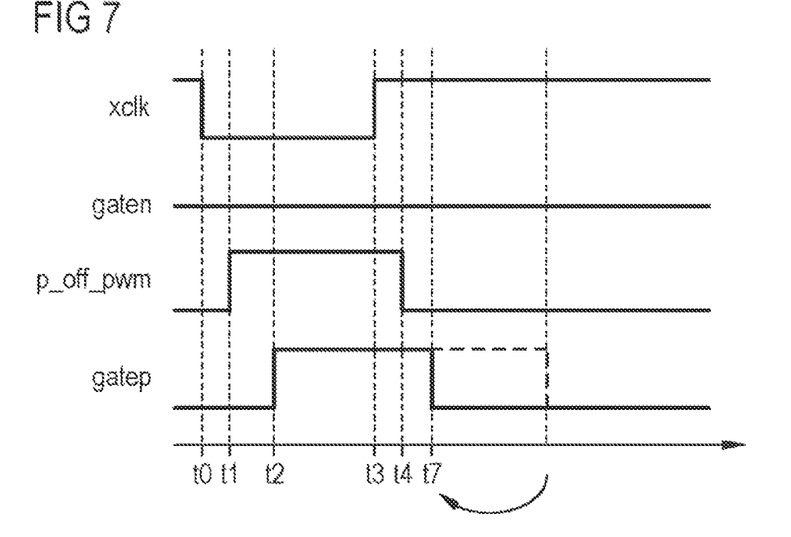
FIG. 7 shows a timing diagram for a control circuit arrangement referring to the high duty cycle condition implementing an open loop in accordance with FIG. 2.

As the feedback control in this example evaluating the state of the gaten signal is deleted, turning the power PMOS transistor 22 on is faster. FIG. 7 illustrates the respective time diagram. As in FIG. 6, the clock signal xclk switches from high to low state at time t0. At this time, it is applied to AND gate 170 as well. At time t1, the NAND gate 130 in the clock control circuit 30 provides the high state of signal p_off_pwm to AND gate 170 and the buffer chain. After some additional time given by the delay in the first buffer chain, gate signal gatep switches to high state at time t2. As clock signal xclk stays in low state, the output of AND gate 170 is still low. As a result, AND gate 160 provides a low signal to the second buffer chain. Gate signal gaten stays at low state during this time. At time t3, clock signal xclk rises to high state and the NAND gate follows shortly afterwards at time t4 bringing its output signal p_off_pwm to a low state. The gate signal gatep driving PMOS transistor 22 drops to a low state, thereby bringing transistor 22 into conduction without waiting for the gaten transition.

Considering that the disoverlap time between the NMOS turn-off and PMOS turn-on must be positive and it is given by $T\_dis = Tdp\_on - Tdn\_off$ in case both are triggered by the same signal, two aspects are clear. First, the disoverlap time guaranteed by the feedback loop is on the one side automatically safe, but it is also much larger. In a worst case condition, the margin taken versus the real need is excessive and detrimental for maximum duty cycle achievement.

The situation could be improved if one could trigger NMOS turn-off and PMOS turn-on with two delayed events, whose time offset T1 is given by the worst case estimation of the difference between Tdn_off and Tdp_on. This ensures a positive value for T_dis and, given the difference of two parameters, it could be much smaller than the worst case disoverlap time predicted by the feedback loop solution, based on a sum of two slow events.

$$T\_dis = Td\_fdbk + Tdp\_on$$

While this additional amount of time is an improvement, the question is how to generate this additional duration. Generating T1 by an analog block is convenient as long as it is large enough to ensure safety margins for a proper operation under substantially all conditions. A possible choice would be to use T1=T0 to save area as a generating analog block is quite large. However, if obtained in this way, the additional amount of time introduced seems to be over-engineered in most possible operating conditions, as T1 must be sized for the worst case condition.

By elimination of the feedback based phase generator, we improved the maximum achievable duty cycle thanks to open loop superior performance in a worst case.

Figure 8:
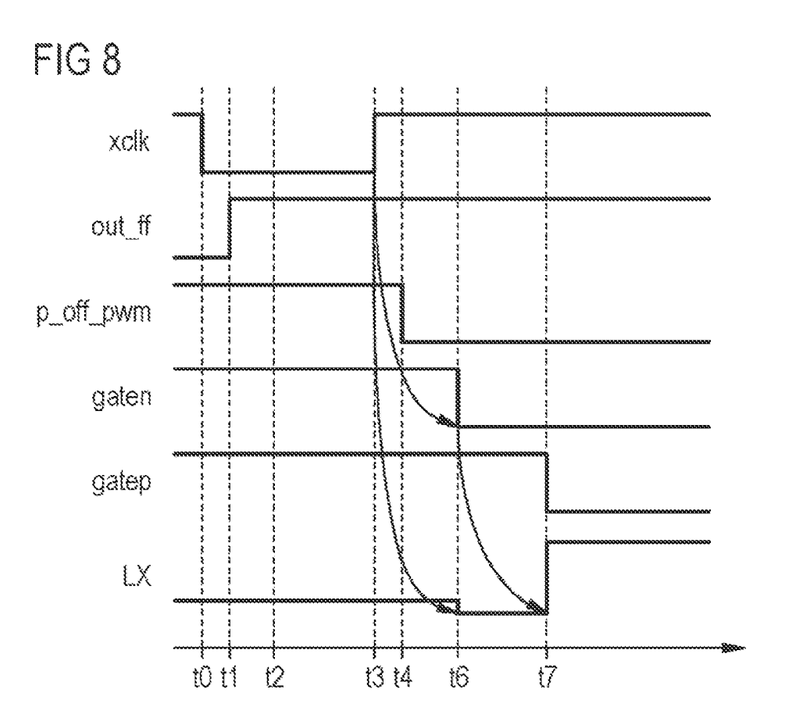
FIG. 8 shows a timing diagram referring to the moderate duty cycle condition illustrating the different modifications in accordance with the embodiment of FIG. 4.
Figure 9:
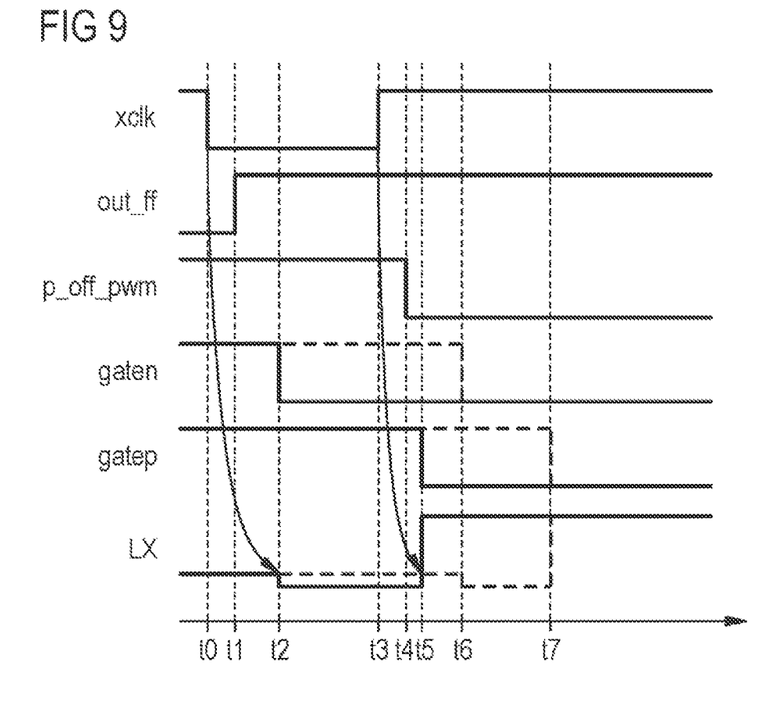
FIG. 9 shows a control circuit with a closed loop referring to the moderate duty cycle condition to drive a complementary driver.
Figure 10:
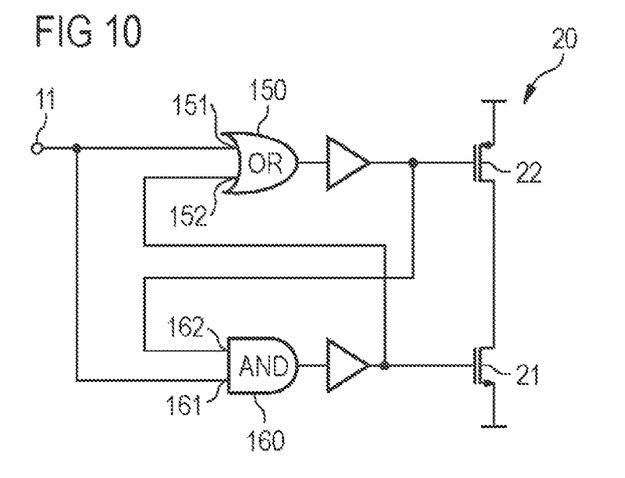
FIG. 10 illustrates a mode control circuit including a closed loop for driving a complementary driver.

FIGS. 8 and 9 show that elimination of the feedback loop in nominal operating conditions results as detrimental when the DC/DC converter operates at moderate duty cycle, where it is not an issue to be able to keep the PMOS off for as short as possible time.

FIG. 8 shows the disoverlap of the control circuit arrangement according to FIG. 1 for a moderate duty cycle operation. This operation represents the most popular application for a DC/DC converter in which the control circuit arrangement is implemented. As it can be seen from the arrows, the limits are generated from the rising edge of clock signal xclk. As previously explained, the high state of xclk provides a transition of signal p_off_pwm to low state and in a response thereto signal gaten switches NMOS transistor 21 to off. Still, the conduction of PMOS transistor 22 depends on the verification of the off state for the NMOS transistor 21 to avoid glitches. That condition is verified by the feedback network in the implementation of FIG. 1. The disoverlap duration comes from internal delays that start from a common origin. As a delay generating the PMOS transistor turning on is conditioned by the NMOS transistor's off state, a disoverlap is guaranteed.

On the other hand, FIG. 9 illustrates the disoverlap time for implementation of the control circuit arrangement according to FIG. 2 in a moderate duty cycle operation. The dotted lines for signal gaten, gatep and LX correspond to the respective signal behavior according to FIG. 8 for a better comparison.

It can be derived from the diagram in FIG. 9 that at time t2, the gate signal gaten drops from high state to low state as clock signal xclk is in the low state and applied to AND gate 170. The transition from high to low state of signal gaten is initiated by the transition of clock signal xclk. The transition of gate signal gatep from high to low state is also initiated by the transition of clock signal xclk to HIGH state, but this time is indicated by the arrow also from clock signal xclk.

Unlike in the arrangement of FIG. 1, the disoverlap boundaries given at times t5 and t2 are not the same but delayed of an amount equal to the duration of the xclk pulse. As the feedback is eliminated, the delay to turn on the PMOS transistor 22 given by the transition of high to low state of gate signal gatep is independent from the state of NMOS transistor 21. Accordingly, it is advisable to keep the duration of xclk larger than a possible difference in delays to generate respective gate signals gaten and gatep. The duration of clock signal xclk in moderate duty cycle operation is sized for worst case conditions and mostly generated from an analog generation block. Accordingly, the disoverlap time is in almost all cases equal to the worst case and as such often larger than the one generated by the closed feedback loop solution. This means that, at least in nominal operating conditions and moderate duty cycle, the feedback structure outperforms the open loop one as larger disoverlap time is detrimental for efficiency.

Figure 3:
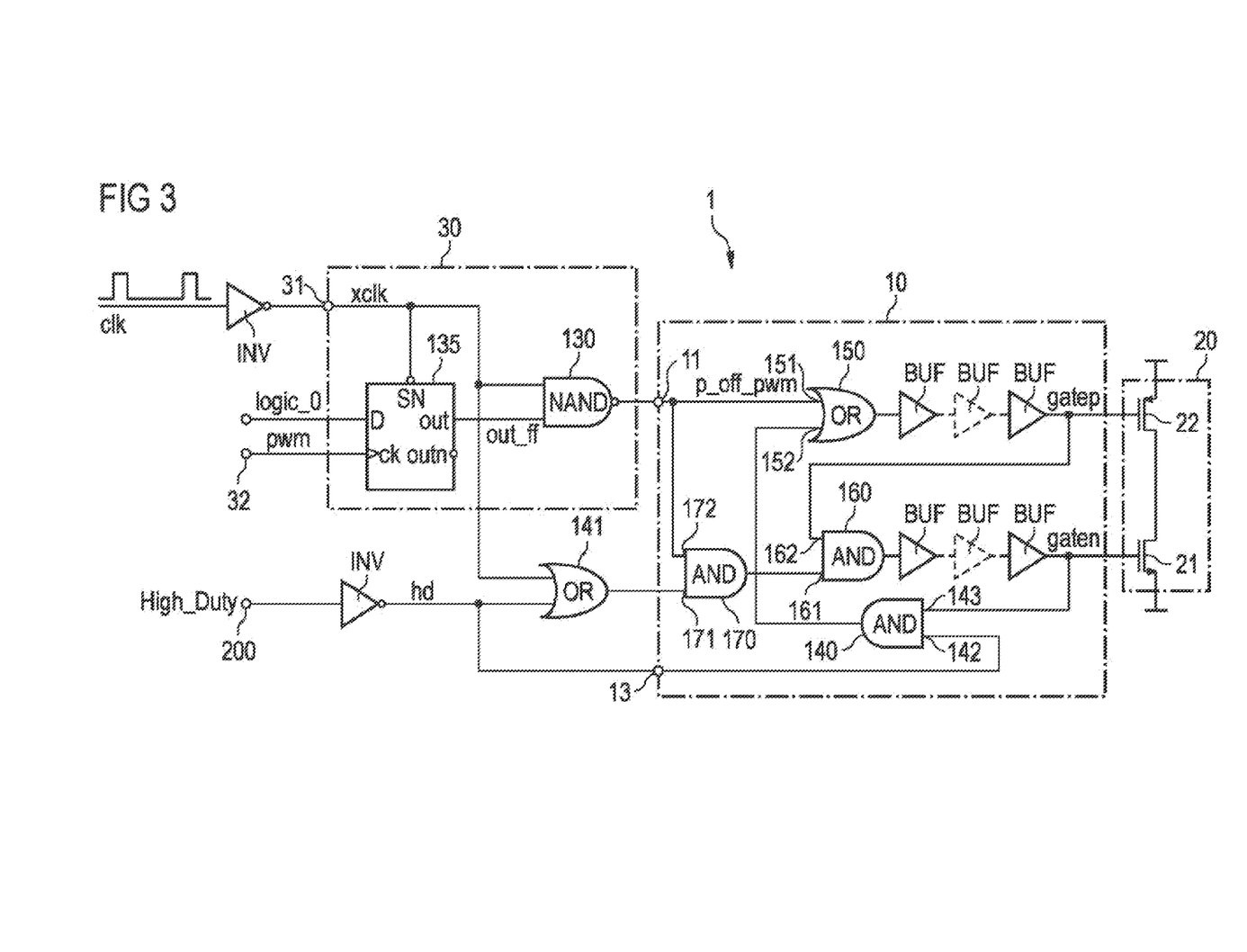
FIG. 3 illustrates a control circuit arrangement operable in a closed or open loop depending on the mode selection signal.

FIG. 3 shows an additional control circuit arrangement which allows exploiting the benefit of both previous illustrated arrangements.

Particularly, the benefits of the modified arrangements at extreme high duty cycles are used while at the same time eliminating its drawbacks at lower duty cycles. For this purpose, both previously illustrated arrangements are combined to such an extent as explained with respect to FIG. 3 in greater detail. Phase generator 10 in this instance comprises an OR gate 150 connected to the first buffer chain to generate the gate signal gatep. A first AND gate 160 connects the second buffer chain to provide gate signal gaten. Gate signal gatep is applied to one of its input terminals of AND gate 160. The other input terminal of logic gate 160 connects to AND gate 170. The input terminal 172 of gate 170 is coupled to first input terminal 11 of phase generator 10 providing a signal applied to input terminal 11 to logic OR gate 150 and AND gate 170. The second input terminal 171 of AND gate 170 is coupled to an OR gate 141 to indicate the respective operation state as it will be explained in greater detail below.

Further, phase generator 10 comprises a third AND gate 140 arranged substantially in the feedback path of the phase generator. A first terminal 143 of AND gate 140 receives gate signal gaten while a second terminal 142 receives a mode selection signal indicating the operation mode of the circuit arrangement. The output of AND gate 140 connects to terminal 152 of OR gate 150.

The mode selection signal substantially selects between two different modes of operation corresponding to the duty cycle. In one operation mode, the feedback network between the AND gate 160 and the OR gate 150 is activated such that the respective gate signals are switched depending on the state of the respective other gate signal. In the second operation mode, the feedback network is bypassed and signal p_off_pwm at terminal 11 directly applied to the first buffer chain.

Under normal conditions, i.e. a moderate duty cycle, signal high duty at terminal 200 is low and inverted by the subsequently arranged inverter to provide mode selection signal hd. That signal is in the high state and applied to AND gate 140 in the phase generator 10 and OR gate 141. Accordingly, the output of OR gate 141 is at high state in substantially all circumstances and particularly irrespectively of the state of clock signal xclk. As a result, the output of AND gate 170 corresponds to signal p_off_pwm (including a small delay determined by the evaluation time of AND gate 170). At the same time, AND gate 140 provides at its output the state of gate signal gaten at its first input terminal 143, respectively. As a result, a feedback network between OR gate 150 and AND gate 160 is established similarly to that of FIG. 1. In moderate duty cycle conditions, the disoverlap time does now depend on the delay in the feedback network and the additional delay by OR gate 141 and the AND gates 140 and 170.

In extreme operating conditions, the high duty cycle at terminal 200 is in the high state. The inverter inverts signal high duty and provides the mode selection signal hd with a low state. Consequently, AND gate 140 is basically switched off and the signal applied to terminal 152 of OR gate 150 is low under all circumstances. As a result, the first buffer chain substantially receives signal p_off_pwm. Further, the OR gate 141 now provides at its output a delayed version of clock signal xclk. That signal is applied to AND gate 170. That mode of operation corresponds basically to the implementation of the control circuit according to FIG. 2.

As a result, the mode selection signal distinguishing between two modes of operation enables the control circuit to be switched in two different operation modes. In the first mode, a feedback network is established generating respective gate signals in response to the state of the other respective gate signal. The feedback network basically evaluates the state of one gate signal and switches the other gate signal in response thereto. In the second mode of operation, the feedback network is bypassed, one of the gate signals generated only in response of the control signal, while the other gate signal is generated in response to the state of the first gate signal.

To evaluate and particularly recognize the respective duty cycle and thereby generate mode selection signal hd, one could use a flip flop circuit. For this purpose, the inverting output of the flip flop corresponds to the high duty signal. At the clock input of the flip flop, the clock signal clk is applied to, while the data input receives the gaten signal. When the gaten signal is at high state, before a rising edge of clock signal clk (corresponding to a falling edge of clock signal xclk) arrives, the inverting output of the flip flop provides a low signal. This means that the duty cycle is not so large and a minimum off-pulse for the PMOS transistor 22 is not of interest.

On the other hand, if gate signal gaten is low when the rising edge of clock signal clk arrives, the high duty signal at the inverting output is set too high, indicating a high duty cycle operation mode. Consequently, the arrangement according to FIG. 3 bypasses the feedback network. Those skilled in the art might recognize that the example refers to a poorly flexible solution which does not fit any possible operating mode in the DC/DC converter.

Figure 4:
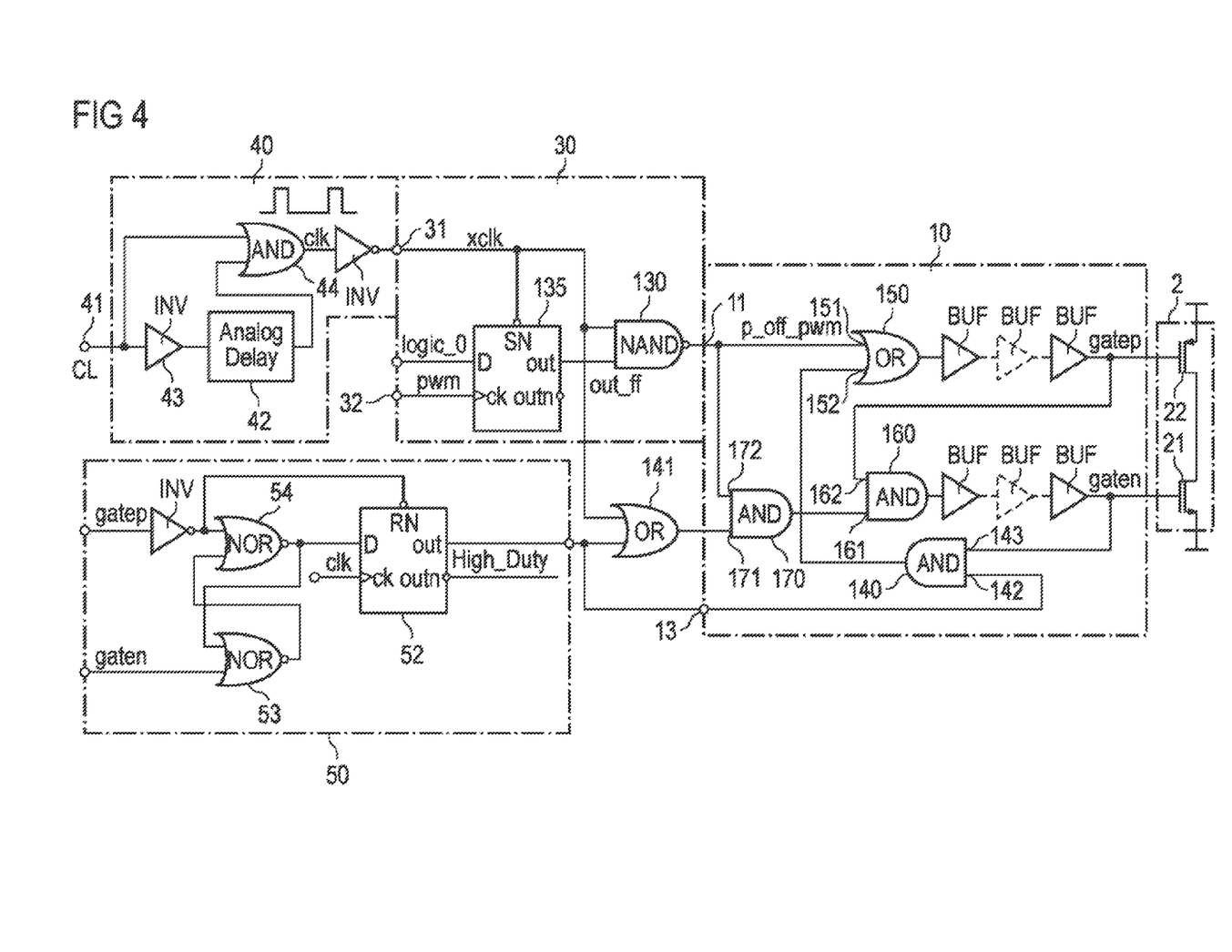
FIG. 4 shows another example of a control circuit arrangement.

FIG. 4 illustrates a further example which also implements a duty cycle recognition circuit as well as a clock generator circuit.

The duty cycle recognition circuit 50 provides a mode selection signal hd to the phase generator 10 in response to the gate signals gatep, gaten and the clock signal clk. For this purpose, the phase generator circuit 50 comprises a flip flop circuit 52 with its output terminal providing the mode selection signal, a data input terminal and a clock input terminal at which clock signal clk is applied. The recognition circuit 50 further includes a first NOR gate 53 and a second NOR gate 54. First input terminals of both NOR gates receive the signals gaten and an inverted gatep signal, respectively. The output of the first NOR gate 53 is coupled to the second input of NOR gate 54. The output of NOR gate 54 connects to a data terminal D of flip flop 52 and to the second input of NOR gate 53.

The clock generator circuit 40 comprises an inverter coupled to terminal 31 to generate the clock signal xclk. The input of the inverter connects to an AND gate 44. The AND gate receives a base signal CL at terminal 41, which is inverted by inverter 43 and then applied to an analog delay cell 42. The output of analog delay cell 42 connects to AND gate 44. The analog delay cell provides the duration of the clock pulse clk or xclk. As the analog delay cell ensures a much smaller spread in process and operating conditions, the maximum allowed on-time for the power PMOS transistor 22 undergoes smaller reduction in worst case conditions.

Figure 5:
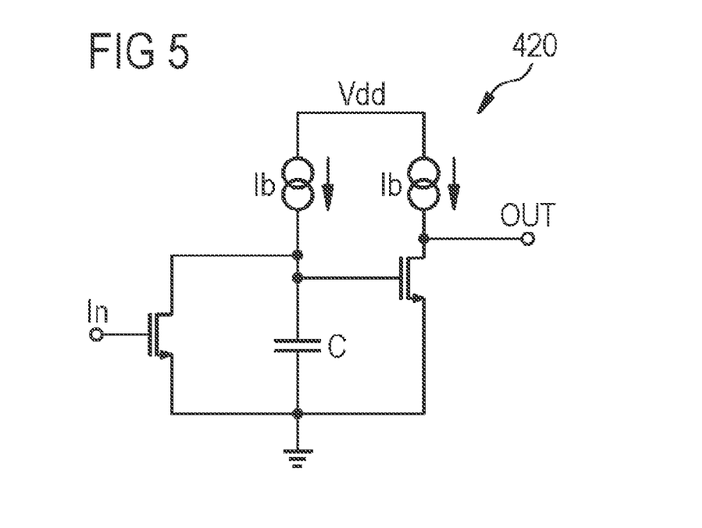
FIG. 5 shows an analog delay unit implemented in the control circuit arrangement.

Referring to FIG. 5, an analog delay cell may comprise a capacitor arranged between a bias current source IB and a ground terminal. A first transistor arranged parallel to capacitor C received the input signal IN. A gate of the second transistor connects to capacitor C. An output node is arranged between the second transistor and a second bias current source. The delay may be preferably given by the RC product, wherein the resistance R is defined by the ratio Vgs/Ib.

The resulting delay defined by the RC product has a small spread versus voltage supply and temperature compared to normal CMOS gates. Moreover, R can be optionally easily trimmed to minimize any process spread variation and ensure even tighter control over maximum PMOS on time. The analog delay cell provides the minimum pulse duration for the clock signal clk referring back to FIG. 4.

The clock signal clk provides the set signal for flip flop 135 as well as the clock signal for flip flop 52 in the duty cycle recognition circuit. The duty cycle recognition circuit senses the signal that comes from a combination of the states of transistors 22 and 21. For this purpose, the respective gate signals gatep and gaten are evaluated. At the rising edge of the clock signal clk, corresponding to the falling edge of clock signal xclk at terminal 31, the respective gate signals are evaluated by the NOR gates 53 and 54. The output of the second NOR gate 54 becomes high if gate signal gaten is high (NMOS transistor 21 starts conducting) while at the same time gatep signal is also high (transistor 22 is not in a conducting state). The output of NOR gate 54 goes back to low state as soon as PMOS transistor 22 starts conducting after the NMOS transistor 21 has been switched off by the respective gaten signal.

Depending on the rising edge of clock signal clk applied to flip flop 52, the signal at data terminal is passed through the output terminal of flip flop 52 and provides the mode selection signal. If a data signal of flip flop 52 is high, it means that a PMOS transistor is already off when clock signal clk rises HIGH and the NMOS transistor starts conducting. This refers to the moderate duty cycle operation and, therefore, the output mode selection signal hd is set too high as well. In case the output signal of flip flop 52 is low, the gaten signal has not yet switched to HIGH, and NMOS transistor 21 not yet conducting. Consequently, this refers to a high duty cycle operation.

Flip flop 135 of control circuit 30 determines the status at the power transistor gates. At the falling edge of signal clk, corresponding to the rising edge of inverted signal xclk, the output out_ff of flip flop 135 is already at high state. The transition of xclk from low to high results in a transition from high to low for signal p_off_pwm. Before this transition of clock signal xclk, the output signal of the NAND gate in the control circuit 30 is always at high state, keeping gate signal gatep in high state as well. Consequently, PMOS transistor 22 is switched off regardless of other signals inside the circuit. The transition of signal p_off_pwm from high to low may result in a transition of the gatep signal from high to low, thereby driving the PMOS transistor 22. This operation is depending on the duty cycle as the second input terminal 152 of OR gate 150 is coupled to AND gate 140 evaluating the mode selection signal.

In a case wherein the duty cycle recognition circuit 50 recognizes a moderate duty cycle condition determined by a high signal at the data input of flip flop 52 at the rising edge of clock signal clk, corresponding to a falling edge of clock signal xclk, mode selection signal hd is high resulting in a pass-through of gate signal gaten by AND gate 140. For the same reason, OR gate 141 has output HIGH. In this way signal p_off_pwm reaches AND gate 161 input regardless xclk status. As signal p_off_pwm is low, the gaten signal is switched to low as well. This transition, passing through AND gate 140 and bringing a low signal at OR gate 150 input 152, allows p_off_pwm low state to reach gatep signal and turn on PMOS transistor 22.

At low mode selection signal hd, corresponding to high duty cycle operation, AND 140 output is low so that the input of OR gate 150 is not conditioned by gate signal gaten. Signal p_off_pwm passes immediately in the delay chain and turns PMOS transistor 22 on without waiting for the NMOS transistor 21 to be recognized as off. It ensures a faster turn on for the PMOS transistor 22 and by such a large duty cycle operation is possible. In addition the implementation ensures that, having signal hd low, the NMOS is already in the off state when PMOS transistor 22 turns on. In fact, being xclk low, the OR gate 141 passes a low signal as input to AND gate 170 which keeps gaten low.

Considering the complementary case, when xclk goes low, signal p_off_pwm at the output of the NAND gate 130 will be at high state irrespective of signal out_ff and signal hd. Consequently, a high gatep signal results directly and turns off PMOS transistor 22 regardless of gaten status.

The illustrated examples of selectable feedback networks to drive a complementary driver provide different modes of operation depending on the duty cycle of a clock signal applied thereto. Particularly, the maximum allowable duty cycle basically depending on the disoverlap time between the NMOS transistor in an off state and the PMOS transistor in an on state, is significantly increased.

Although the apparatus and methods have been described in connection with specific forms thereof, it will be appreciated that a wide variety of equivalents may be substituted for the specified elements described herein without departing from the spirit and scope of this disclosure as described in the appended claims.

The invention claimed is:

1. Control circuit arrangement for pulse-width modulated DC/DC converter comprising:
 a phase generator for a driver which provides respective gate signals (gaten, gatep) to a first and a second driver transistor, the phase generator comprising a first input terminal for a control signal (p_off_pwm); and
 a clock control circuit having a clock input terminal for a clock signal (xclk) and an input terminal for a pulse width modulated signal (pwm), the clock control circuit providing the control signal (p_off_pwm) in response to signal edges of the pulse width modulated signal (pwm) and the clock signal (xclk) applied thereto;
 wherein the phase generator further comprises a mode selection input terminal for a mode selection signal (hd), and
 the phase generator comprises a selection circuit to select a first mode of operation or a second mode of operation based on the mode selection signal (hd), and
 the phase generator provides a) in the first mode of operation each of the gate signals (gaten, gatep) in response to the control signal (p_off_pwm) and in response to the respective other gate signal, b) in the second mode of operation a first one of the gate signals (gaten, gatep) in response to the control signal (p_off_pwm), and c) a second one of the gate signals (gaten, gatep) in response to the control signal (p_off_pwm) and the clock signal (xclk).

2. The control circuit arrangement according to claim 1, wherein the phase generator provides in the first mode of operation each of the gate signals (gaten, gatep) in response to a logic operation with the control signal (p_off_pwm) and the respective other gate signal.

3. The control circuit arrangement according to claim 1, wherein the phase generator provides in the second mode of operation the second one of the gate signals (gaten, gatep) in response to a logic operation with the control signal (p_off_pwm) and the clock signal (xclk).

4. The control circuit arrangement according to claim 1, wherein the phase generator provides in the second mode of operation the second one of the gate signals (gaten, gatep) in response to a logic operation with the control signal (p_off_pwm) and the first one of the gate signals (gaten, gatep).

5. The control circuit arrangement according to claim 1, wherein the mode selection signal (hd) is dependent from a duty cycle of the pulse width modulated signal (pwm) or from a duty cycle of the clock signal (xclk).

6. The circuit arrangement according to claim 1, wherein the phase generator comprises a first logic gate coupled to the gate of the first driver transistor and a second logic gate coupled to the gate of the second driver transistor, wherein a first input of the first and second logic gates receive the control signal (p_off_pwm), and the second input of the first logic gate is coupled to the selection circuit and the second input of the second logic gate is coupled to the gate of the first driver transistor.

7. The circuit arrangement according to claim 1, wherein the phase generator comprises a third logic gate coupled to the second logic gate to provide the control signal (p_off_pwm) to the first input of the second logic gate depending on the clock signal (xclk) in the second mode of operation.

8. The circuit arrangement according to claim 1, wherein the selection circuit comprises a first logic gate which receives on a first input a gate signal (gaten) of one of the first and second driver transistor, receives on a second input the mode selection signal (hd) or a signal derived by it, and provides the gate signal (gatep) of the other one of the first and second driver transistor the first mode of operation.

9. The circuit arrangement according to claim 8, wherein, the selection circuit comprises a second logic gate which provides in the second mode of operation the clock signal (xclk) to the third logic gate.

10. The circuit arrangement according to claim 1, further comprising a clock generator which provides the clock signal (xclk) in response to a base clock (cl), the clock generator comprising a delay unit which determines a pulse width of the clock signal (xclk).

11. The circuit arrangement according to claim 10, wherein the delay unit comprises at least one analog delay cell to receive the base clock and provides a delayed base clock signal.

12. The circuit arrangement according to claim 11, wherein the delay time depends on an RC-product within the delay cell.

13. The circuit arrangement according to claim 1, further comprising a duty cycle recognition circuit coupled with its inputs to the gate of the second driver transistor and the input terminal for the clock signal (clk, xclk), the duty cycle recognition circuit providing the mode selection signal (hd) in response to an offset between edges of the clock signal (clk, xclk) and the gate signal (gaten) of the second driver transistor.

14. The circuit arrangement according to claim 13, wherein the duty cycle recognition circuit comprises a flip-flop circuit with a data input (D) to receive the gate signal (gaten) of the second driver transistor or a signal derived by it and a clock input (ck) to receive the clock signal (clk, xclk), wherein the output of the flip-flop is coupled to the mode selection input terminal.

15. The circuit arrangement according to claim 13, wherein the duty cycle recognition circuit comprises two logic gates coupled with their outputs to a first input of the respective other gate and with their second input to the gates of the first and second driver transistor, respectively.

16. A method of controlling a pulse-width modulated DC/DC converter having a driver comprising a first and a second driver transistor, comprising:

sensing a state of gate signals (gaten, gatep) at the first driver transistor at a rising edge of a timing dock signal (clk, xclk);

signals a state of gate signs (gaten, gatep) at the second driver transistor at a rising edge of a timing clock signal (clk, xclk);

1) generating a mode selection signal (hd) in response to the sensing; and generating the gate signals (gaten, gatep) in response to the timing clock signal (clk, xclk) and in response to the state of the respective other gate signal in a first state of the mode selection signal (hd) or 2) generating the gate signals (gaten, gatep) in response to the timing dock signal (clk, xclk) in a second state of the mode selection signal (hd);

providing a pulse width modulated signal (pwm);

generating a control signal (p_off_pwm) in response to signal edges of the pulse width modulated signal (pwm) and the timing clock signal (xclk); and a) generating each of the gate signals (gaten, gatep) in response to the control signal (p_off_pwm) and in response to the state of the respective other gate signal in the first state of the mode selection signal (hd);

b) generating a first one of the gate signals (gaten, gatep) in response to the control signal (p_off_pwm) in the second state of the mode selection signal (hd); and c) a second one of the gate signals (gaten, gatep) in response to the control signal (p_off_pwm) and the timing clock signal (clk, xclk) in the second state of the mode selection signal (hd).

17. The method of claim 16, wherein the gate signals (gaten, gatep) in the first state of the mode selection signal are also generated in response to a pulse width modulated signal.

18. The method of claim 16, wherein the gate signals (gaten, gatep) in the first state of the mode selection, signal are generated in response to a logic operation with the timing clock signal (clk, xclk) and the respective other gate signal.

19. The method of claim 16, wherein one of the gate signals (gaten, gatep) in the second state of the mode selection signal is generated in response to a logic operation with the timing clock signal (clk, xclk) and the respective other gate signal.

20. The method of claim 16, wherein the gate signals (gaten, gatep) in the first state of the mode selection, signal are generated in response to a logical combination of the control signal (p_off_pwm) with the respective other gate signal.

21. The method of claim 16, wherein the second one of the gate signals (gaten, gatep) is generated in response to a logical combination of the control signal (p_off_pwm) with the timing clock signal (clk, xclk) in the second state of the mode selection signal (hd).

* * * * *